(12) United States Patent
Afzali-Ardakani et al.

(10) Patent No.: US 6,918,982 B2
(45) Date of Patent: Jul. 19, 2005

(54) SYSTEM AND METHOD OF TRANSFER PRINTING AN ORGANIC SEMICONDUCTOR

(75) Inventors: Ali Afzali-Ardakani, Yorktown Heights, NY (US); Hendrik Hamann, Mohegan Lake, NY (US); Praveen Chaudhari, Briarcliff Manor, NY (US); Robert Von Gutfeld, New York, NY (US)

(73) Assignee: International Business Machines Corporation, Armonk, NY (US)

(*) Notice: Subject to any disclaimer, the term of this patent is extended or adjusted under 35 U.S.C. 154(b) by 43 days.

(21) Appl. No.: 10/314,632

(22) Filed: Dec. 9, 2002

(65) Prior Publication Data

US 2004/0108047 A1 Jun. 10, 2004

(51) Int. Cl.[7] .................. B44C 1/175; B32B 31/00; B32B 31/28; B05D 5/12; H01L 51/40
(52) U.S. Cl. ............. 156/230; 156/272.2; 156/272.8; 427/96; 427/146; 430/199; 430/200; 430/206; 430/211
(58) Field of Search .................. 156/230, 232, 156/233, 238, 240, 241, 247, 277, 280, 272.2, 272.8; 427/96, 146, 147, 148; 428/914; 430/126, 199, 200, 206, 211

(56) References Cited

U.S. PATENT DOCUMENTS

| | | | |
|---|---|---|---|
| 4,631,602 A | * 12/1986 | Chouinard et al. | 360/16 |
| 4,743,463 A | 5/1988 | Ronn et al. | 427/53.1 |
| 4,752,455 A | 6/1988 | Mayer | 427/53.1 |

(Continued)

FOREIGN PATENT DOCUMENTS

| | | |
|---|---|---|
| JP | 63143563 | 6/1988 |
| JP | 02-002019 | * 1/1990 ............ B41J/2/32 |

OTHER PUBLICATIONS

H. Gleskova et al., "*Electrophotographically Patterned Thin–Film Silicon Transistors*", vol. 17, No. 6, p. 264–266, IEEE Electronic Device Letter, Jun. 1996.

Brown et al., "*Precursor Route Pentacene Metal–Insulator–Semiconductor field–Effect*", American Institute of Physics, Feb. 15, 1996.

Y. Y. Lin et al., "*Pentacene–Based Organic Thin–Film Transistors*", vol. 44, No. 8, p. 1325–1331, IEEE Transactions on Electron Devices, Aug. 1997.

Y. Y. Lin et al., "*High–Mobility Pentacene Organic Thin Film Transistors*", $54^{th}$ Device Research Conference Digest, p. 80–81, Jun. 1996.

Y. Y. Lin et al., "*High–Mobility Pentacene Organic Thin Film Transistors*", $55^{th}$ Device Research Conference Digest, p. 60–61, Jun. 1997.

Bao et al., "*Soluble and Processable Regioregular Ply (3 Hexylthiophene) for Thin Film Field–Effect Transistor Applications With High Mobility*", American Institute of Physic, Dec. 23, 1996.

(Continued)

Primary Examiner—J. A. Lorengo
(74) Attorney, Agent, or Firm—Ohlandt, Greeley, Ruggiero & Perle, L.L.P.; Robert M. Trepp

(57) ABSTRACT

The present invention provides a substrate having thereon a patterned small molecule organic semiconductor layer. The present invention also provides a method and a system for producing a substrate having thereon a patterned small molecule organic semiconductor layer. The substrate having thereon a patterned small molecule organic semiconductor layer is produced by exposing a donor substrate having thereon a small molecule organic semiconductor layer to energy to cause the thermal transfer of a small organic molecule onto an acceptor substrate.

43 Claims, 6 Drawing Sheets

U.S. PATENT DOCUMENTS

| | | | |
|---|---|---|---|
| 4,895,735 A | | 1/1990 | Cook .......................... 427/43.1 |
| 4,970,196 A | | 11/1990 | Kim et al. ...................... 505/1 |
| 4,987,006 A | | 1/1991 | Williams et al. ............ 427/53.1 |
| 5,342,817 A | * | 8/1994 | Sarraf .......................... 503/227 |
| 5,450,117 A | * | 9/1995 | Quanz ......................... 347/217 |
| 5,475,418 A | * | 12/1995 | Patel et al. .................. 347/256 |
| 5,489,937 A | * | 2/1996 | Akutsu et al. ............... 347/262 |
| 5,512,126 A | * | 4/1996 | Kannabiran et al. ...... 156/380.9 |
| 5,725,706 A | | 3/1998 | Thoma et al. ............... 156/150 |
| 5,812,173 A | * | 9/1998 | Gilbert et al. ............... 347/176 |
| 5,851,709 A | * | 12/1998 | Grande et al. .................. 430/7 |
| 5,917,530 A | * | 6/1999 | Hutt et al. ................... 347/171 |
| 5,946,511 A | | 8/1999 | Balling et al. ............... 396/401 |
| 5,981,970 A | | 11/1999 | Dimitrakopoulos et al. .. 257/40 |
| 6,025,110 A | | 2/2000 | Nowak ........................ 430/200 |
| 6,036,809 A | | 3/2000 | Kelly et al. .................. 156/247 |
| 6,143,117 A | | 11/2000 | Kelly et al. .................. 156/233 |
| 6,177,151 B1 | | 1/2001 | Chrisey et al. .............. 427/596 |
| 6,194,119 B1 | | 2/2001 | Wolk et al. .................. 430/200 |
| 6,207,472 B1 | | 3/2001 | Callegari et al. .............. 438/99 |
| 6,228,555 B1 | * | 5/2001 | Hoffend et al. .............. 430/200 |
| 6,291,116 B1 | | 9/2001 | Wolk et al. .................. 430/200 |
| 6,291,126 B2 | | 9/2001 | Wolk et al. .................. 430/200 |
| 6,402,866 B1 | | 6/2002 | Casey et al. ............. 156/89.12 |
| 6,405,013 B2 | | 6/2002 | Haneda et al. ............... 399/330 |
| H002084 H | * | 10/2003 | Picciolo et al. ............. 428/690 |
| 2002/0015907 A1 | | 2/2002 | Wolk et al. .................. 430/200 |
| 2002/0053320 A1 | | 5/2002 | Duthaler et al. ............. 118/249 |

OTHER PUBLICATIONS

Garnier et al., *"Structural Basis for High Carrier Mobility in Conjugated Oligomers"*, The Materials Science of Conductive Polymers, Atlanta, GA, Apr. 19, 1991.

Klauk et al., *"Pentacene Organic Thin–Film Transistors and Ics"*, www.solid-state.com, p. 63–76, Mar. 2000.

Dimitrakopoulos et al., *"Molecular Beam Deposited thin Films of Pentacene for Organic Field Effect Transistor Applications"*, American Institute of Physics, Aug. 1996.

Bao et al., *"Organic Field–Effect Transistors with High Mobility Based on Copper Phthalocyanine"*, American Institute of Physic, Nov. 11, 1996.

Herwig et al., *"A Solube Pentacene Precursor: Synthesis Solid–State Conversion into Pentacene and Application in a Field–Effect Transistor"*, Advance Material, vol. 11, No. 6, p. 480–483, 1999.

\* cited by examiner

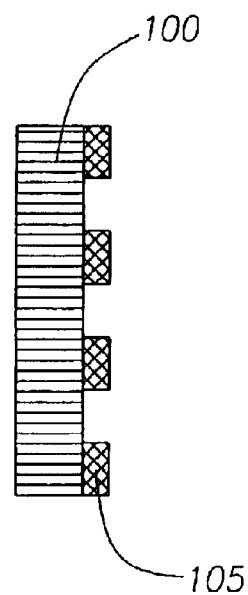
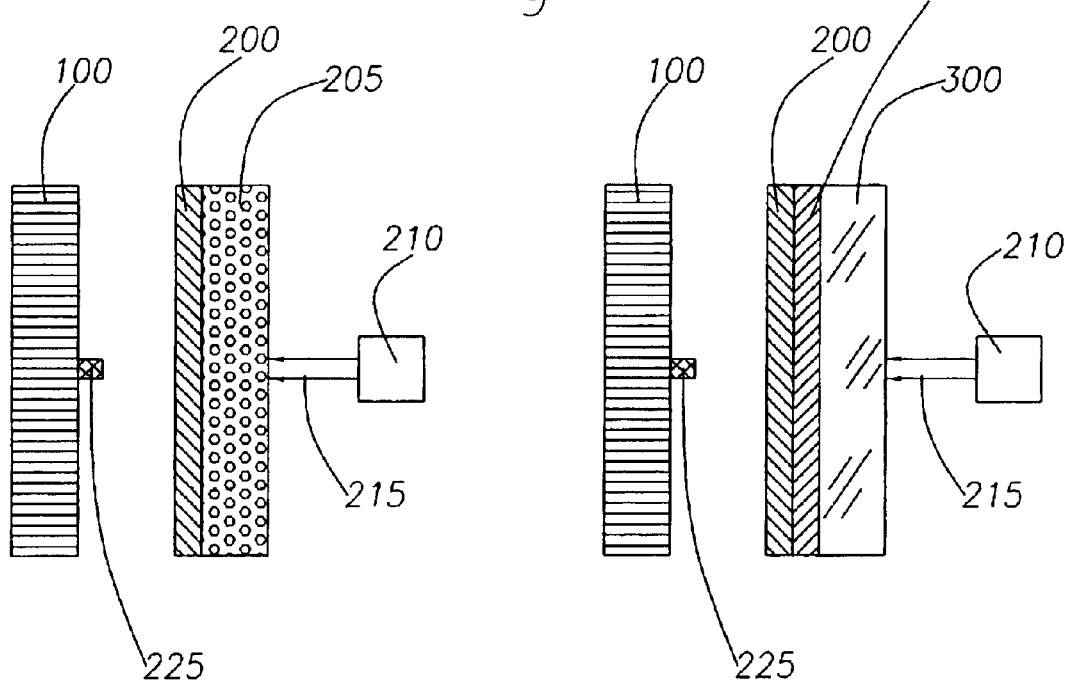
Fig. 1
Fig. 2
Fig. 3

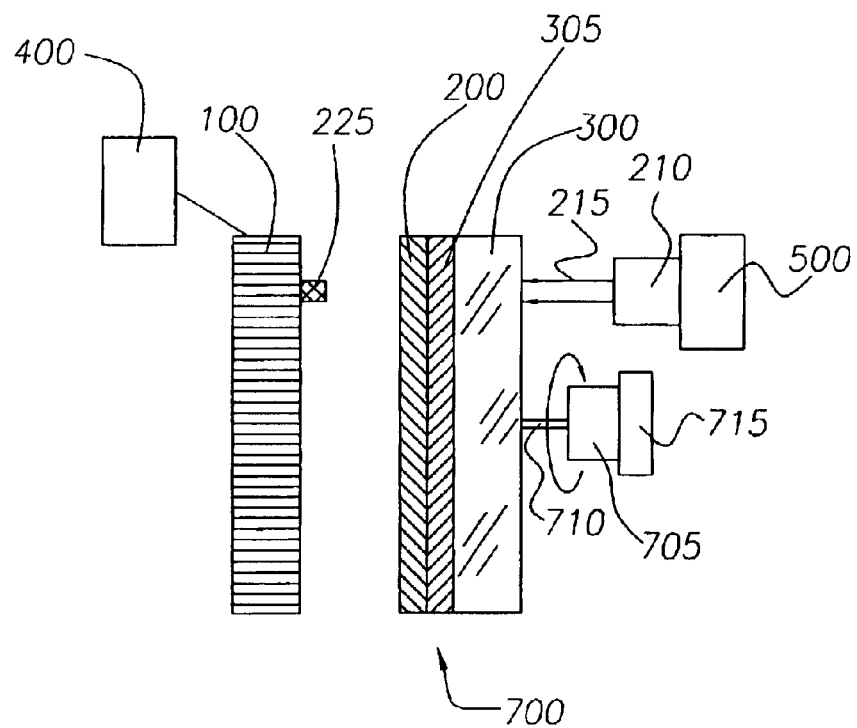
Fig. 7
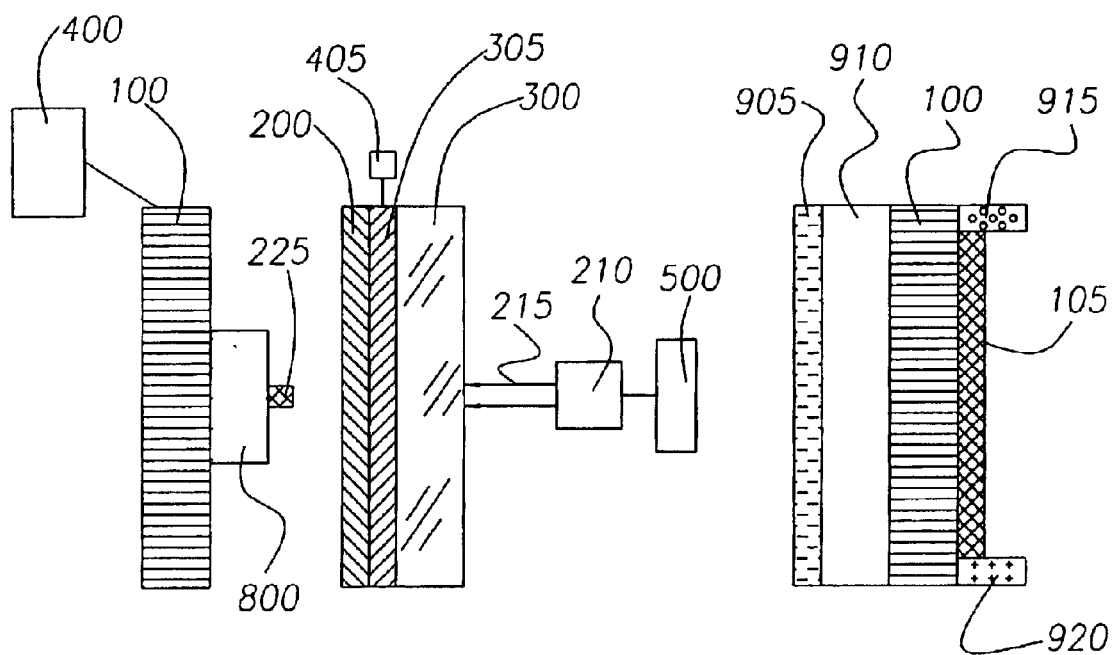
Fig. 8
Fig. 9

SYSTEM AND METHOD OF TRANSFER PRINTING AN ORGANIC SEMICONDUCTOR

This application is related to commonly-owned U.S. Application entitled "The Use of an Energy Source to Convert Precursors into Patterned Semiconductors," Ser. No. 10/314,607, filed herewith on the same day, Dec. 9, 2002, cross-referenced and incorporated herein by reference.

BACKGROUND OF THE INVENTION

1. Field of the Invention

The present invention relates to substrates having thereon a patterned small molecule organic semiconductor layer. The invention also relates to a method and a system for the production of such substrates having patterned small molecule organic semiconductor layers thereon. The patterned small molecule organic semiconductor layer is formed by the thermal transfer of a small molecule organic semiconductor or its precursor from a donor substrate to an acceptor substrate. More particularly the present invention relates to a substrate having thereon a patterned pentacene semiconductor layer.

2. Description of the Prior Art

The concept of transfer printing of inks and various metals is one that has been known for some time. The general idea involves a substance adhering or affixed to a first surface to be transferred to a second surface with or without direct physical contact between the two surfaces. This type of transfer is well known in non-impact printing of text and also used for transfer of various metals from a first surface to a second surface, usually by way of local pulsed heating of the donor surface. The present invention utilizes preferably a flexible substrate or ribbon or other donor substrates (not necessarily flexible) which contain a small molecule organic semiconducting compound or its precursor that can be locally heated resulting in a transfer, likely by sublimation, of the small molecule organic semiconducting or precursor material from the donor surface resulting in adhesion of the organic semiconductor onto a second or acceptor surface. The transfer of material can be used to define a localized pattern on the acceptor substrate, for example a material that can be used to create a component of a semiconducting device. When the heating method utilizes a focused laser beam, either incident on the semiconducting material or precursor of a small molecule semiconductor such as pentacene, a very narrow and well defined transfer can be achieved to define a part of a semiconducting device, for example the channel of a field effect transistor (FET) or various other semiconducting devices.

Non-impact transfer printing has been used for a variety of applications for a number of years. This form of printing can be divided into two categories; first, one in which there is no contact between the first surface of the donor substrate from which material is transferred and the first surface receiving the material; and second, one in which the two surfaces are in contact but in which there is no impact to impart the material from the first surface of the donor to the first surface of the acceptor. Examples of these types of material transfers are well known in the literature. The transfer of material from a donor surface to an acceptor surface where the acceptor surface may have been previously chemically treated to cause a chemical reaction with the transferred material has been described extensively. For example, ink jet type printers for printing semiconductors and other components of semiconductor devices have been known for some time and are described again most recently in U.S. 2002/0053320 A1.

U.S. Pat. No. 6,344,660 describes impact printing which involves contact between a first and second substrate, wherein the first substrate carries ink or some metal that is to be transferred to the second substrate by local heating, stamping, or spin coating.

When melting is used to transfer material, the source of heat may be a focused laser beam incident on the donor substrate, with a portion of the laser or other energy beam absorbed by the first surface which may be a ribbon. Alternatively, the ribbon may contain an electrically conducting stripe which can be used for localized printing due to the contact of a high resistance element between the contact point on the ribbon and the electrically conducting stripe in which case this form of heating takes the place of the laser to cause the melting and transfer of the material. Print heads that heat the ribbon in one or more places simultaneously are also well known to achieve thermal transfer.

However, there is no prior art known to us in which semiconducting materials are transferred to a second substrate in a crystalline form. In general, to transfer a semiconductor from one surface to a second surface has been achieved by the melting of the material which then is transferred by vaporization from the molten state to a second substrate resulting in an amorphous film. In general, this technique has been widely used in the processing of electroluminescent devices but without the use of a precursor that includes a small organic semiconducting molecule.

It has recently been discovered that small organic semiconducting molecules, such as pentacene, can be thermally transferred from certain substrates (donor substrate) to a second substrate (acceptor substrate) using localized heating. This results in a type of small molecule deposition using energy to provide the thermal energy for the transfer. This type of transfer can be made in a partial vacuum. In more recent experiments it has been found that intimate contact between the donor substrate (containing a pre-deposited small molecule organic semiconductor layer of either the small organic molecule itself or a precursor to that small molecule) and the acceptor substrate yield extremely fine thermally transferred patterns of the small organic molecule onto the acceptor substrate using a focused laser beam. It has been found that the transfer can take place in an ambient atmosphere since the contact between donor and acceptor are sufficiently close to one another that very little, if any of the atmosphere is trapped between the contacting substrates nor can the ambient air enter between the acceptor and donor. This type of intimate contact also precludes the possibility of any substantial contamination of the transferred organic (e. g. pentacene) from the outside ambient.

Thin-film transistors and other electronic devices using organic semiconductors, such as pentacene, are emerging as alternatives to established methods using amorphous silicon ($\alpha$-Si:H) as the semiconductor.

A variety of organic compounds have been proposed and tested as semiconducting materials for TFT devices. For example, among the p-channel (hole transport) materials that have been characterized are thiophene oligomers proposed as organic semiconductor material for TFT in Garnier, F., et al., "Structural basis for high carrier mobility in conjugated oligomers" Synth. Meth., Vol. 45, p. 163 (1991), and phthalocyanines described in Bao, Z., et al., "Organic Filed-effect transistors with high mobility based on copper phthalocyanine" Appl. Phys. Lett., Vol. 69, p. 3066 (1996).

Pentacene, which is a member of poly(acene) compounds has been proposed as an organic semiconductor material in Lin et al. IEEE 54th Annual Device Research Conference, 1996, pages 2136–2139, and Dimitrakopoulos et al., J. Appl. Phys., 80 (4), 1996, pages 2501–2507.

Some soluble organic compounds have also been characterized as organic semiconducting materials. For example poly(3-alkylthiophene) described in Bao, Z., et al., "Soluble and Processable regioregular poly(3-hexylthiophene) for thin film field-effect transistors application with high mobility" Appl. Phys. Lett., Vol. 69, page 4108 (1996).

An attractive material would have a high carrier mobility which is close to that of amorphous silicon (0.1–1 $cm^2.V^{-1}.s^{-1}$), with a very high on/off ratio (>$10^5$). For an organic material to replace amorphous silicon would have not only the electrical properties cited above but also should be processable from solution so that it could become commercially attractive.

Among the organic compounds which have been studied as semiconductors, only regioregular poly(3-hexylthiophene) is readily soluble in organic solvents and thin films of this compound have been processed from solution for construction of TFTs. The drawback for this compound is that it has relatively low ($5 \times 10^{-2}$ $cm^2.V^{-1}.s^{-1}$) carrier mobility and even much less satisfactory on/off ratio of less than 100. In addition, because thin films of this polymer are not stable in air and its field-effect characteristics deteriorate on exposure to air, its application as semiconductor becomes less desirable.

The best performance as a semiconductor among organic materials to date has been achieved by thin films of pentacene deposited under high vacuum and temperature as reported by Dimitrakopoulos et al., in U.S. Pat. Nos. 5,946,511; 5,981,970 and 6,207,472 and other publications by Brown et al., J. Appl. Phys. 80(4), 1996, pages 2136–2139 and Dimitrakopoulos et al., J. Appl. Phys. 80(4), pages 2501–2507.

Recently, thin-film transistors on plastic substrates using evaporated films of pentacene as the p-channel carrier with mobility of 1.7 $cm^2.V^{-1}.s^{-1}$ and an on/off ratio of $10^8$ have been reported by Jakson et al., in Solid State Technology, Vol. 43 (3), 2000, pages 63–77.

Thin films of pentacene are very stable in air and even moderate temperatures and as far as performance is concerned, pentacene is probably the most attractive organic material to date to replace amorphous silicon.

The drawback of pentacene is that it is insoluble in common organic solvents and can only be deposited as a thin film by expensive high vacuum and temperature techniques.

There has been very little effort for the synthesis of soluble pentacene derivatives and the only example of soluble pentacene is by Muellen, K. et al., "A soluble pentacene precursor: Synthesis, solid-state conversion into pentacene and application in a field-effect transistor," Adv. Mat. 11(6), p. 480 (1999), in which a precursor of pentacene is synthesized by a tedious multi-step synthetic approach. The derivative, which is soluble in organic compounds and can be processed from solution, is converted back to pentacene by heating at moderate to high temperatures (140–200° C.).

The drawback for using this compound as a pentacene precursor is that due to the multi-step synthesis (more than 9 steps), its preparation, especially in large scale is impractical. In addition, its conversion to pentacene occurs at a relatively high temperature which prevents the use of most plastics as substrates.

Commonly owned and copending application entitled "Hetero Diels-Alder Adducts of Pentacene as Soluble Precursors of Pentacene," Ser. No. 10/300,645, Filed on Nov. 20, 2002, IBM ref: YOR920020160US1, contents of which are incorporated herein by reference, describes a specially prepared pentacene precursor that can be spun, dipped, or sprayed onto a substrate from which a small molecule organic semiconductor can result from simple thermal processing of the precursor. The precursor, after application to a substrate, is then allowed to dry. Upon heating the substrate (upon which the dried precursor film resides) on a hot plate at temperatures of 200° C. or less for several minutes or less the precursor has been shown to transform into a pure small molecule organic semiconductor, such as pentacene. Commonly owned and copending application entitled "Thin Film Transistors Using Solution Processed Pentacene Precursor as Organic Semiconductor," Ser. No. 10/300,630, filed on Nov. 20, 2002, IBM ref: YOR 920020161US1, contents of which are incorporated herein by reference, describes the application of a solution processed polycyclic aromatic compound precursors as an organic semiconducting material in thin film transistors.

The present invention describes a method and a system for producing a substrate having thereon a patterned small molecule organic semiconductor layer, and the patterned substrate itself, wherein the patterned small molecule organic semiconductor layer is produced from the thermal transfer of the small organic molecule from a donor. The small organic molecule feature distinguishes the present invention from those that have transferred polymer or polymer semiconductors from one surface to a second surface in several ways. There is interest in the use of small molecule organic semiconductors in manufacturing items such as light emitting diodes, photodiodes, and field effect transistors (FET's). The present invention provides a cost savings from the usual method of semiconductor device production which normally employs expensive lithographic processes here circumvented by the present invention.

Organic semiconductors are generally cheaper to produce for these applications and are also easier to process as they can be deposited at low temperatures. In addition, this widens the choice of possible substrates including flexible ones that are available in large areas such as MYLAR™ and KAPTON™.

The prior art does not disclose the transfer of small molecules using a simple process of thermal transfer to form patterned layers of the small organic molecule semiconductor material in crystalline form on a substrate.

Accordingly, it is an object of the present invention to provide a method and a system for producing a substrate having thereon a patterned small molecule organic semiconductor layer produced by exposing a donor substrate having thereon a small molecule organic semiconductor layer to energy thus causing the thermal transfer of the small organic molecule onto an acceptor substrate to form the patterned small molecule organic semiconductor layer thereon. The principal application addresses the manufacture of organic field effect transistors (FET's) and organic light emitting diodes on a large scale that that is essentially automated. However, the apparatus and method are not limited to pentacene and can have applications to organic compounds other than pentacene, especially small organic semiconductor molecules.

SUMMARY OF THE INVENTION

The present invention provides a substrate having thereon a patterned small molecule organic semiconductor layer having a small organic molecule thermally transferred by exposing a donor substrate having thereon a small molecule organic semiconductor layer to energy.

The present invention further provides a method of preparing a substrate having thereon a patterned small molecule organic semiconductor layer, involving the exposure of a donor substrate having thereon a small molecule organic semiconductor layer to energy produced from an energy source to cause the thermal transfer of a small organic molecule onto an acceptor substrate to produce a substrate having thereon the patterned small molecule organic semiconductor layer.

The present invention also provides a system for producing a substrate having thereon a patterned small molecule organic semiconductor layer. The system has a donor substrate having thereon a small molecule organic semiconductor layer; an acceptor substrate positioned to receive said patterned small molecule organic semiconductor layer upon exposing the donor substrate to energy; and an energy source to produce said energy to cause the thermal transfer of a small organic molecule onto the acceptor substrate.

BRIEF DESCRIPTION OF THE DRAWINGS

FIG. 1 shows a substrate having thereon a patterned small molecule organic semiconductor layer.

FIG. 2 shows a system incorporating an acceptor substrate, a donor substrate of energy absorbing material having thereon a small molecule organic semiconductor layer, and energy produced from an energy source yielding a maskless pattern on the acceptor substrate.

FIG. 3 shows a system incorporating an acceptor substrate, a donor substrate of energy transparent material having thereon a small molecule organic semiconductor layer with an energy absorbing film interposed between the two, and energy produced from an energy source.

FIG. 7 shows a representative system and method of the invention with the donor substrate being a rotatable disk with means to rotate around its axis and means to move the rotatable disk relative to the energy source and the acceptor substrate. The energy source and acceptor substrate also have means for movement.

FIG. 8 shows a representative system and method of the invention where the acceptor substrate has a component of an electronic structure thereon.

FIG. 9 shows an acceptor substrate with the elements of a field effect transistor (FET) thereon and a patterned small molecule organic semiconductor layer deposited as the channel of the FET without the use of a mask.

DETAILED DESCRIPTION OF THE INVENTION

Figure 4:
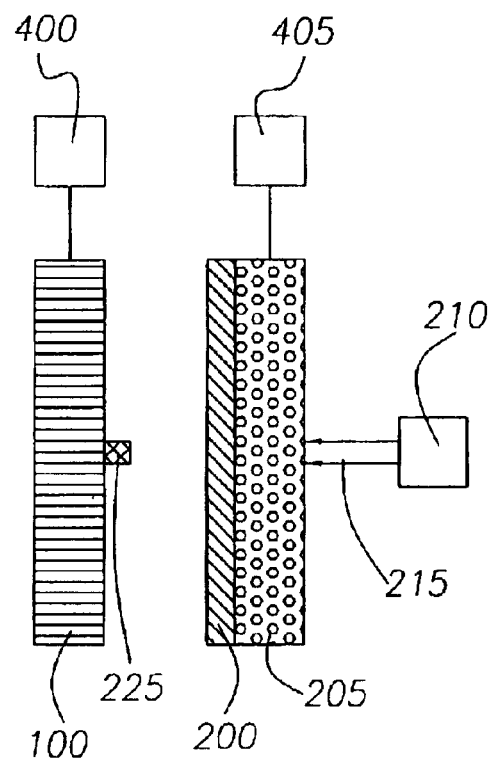
FIG. 4 shows a representative system of this invention with means for moving the donor and acceptor substrates relative to each other and the energy.

The present invention provides a substrate having thereon a patterned small molecule organic semiconductor layer having a small organic molecule thermally transferred by exposing a donor substrate having thereon a small molecule organic semiconductor layer to energy.

The present invention further provides a method of preparing a substrate having thereon a patterned small molecule organic semiconductor layer, involving the exposure of a donor substrate having thereon a small molecule organic semiconductor layer to energy produced from an energy source to cause the thermal transfer of a small organic molecule onto an acceptor substrate to produce a substrate having thereon the patterned small molecule organic semiconductor layer.

The present invention also provides system for producing a substrate having thereon a patterned small molecule organic semiconductor layer. The system has a donor substrate having thereon a small molecule organic semiconductor layer; an acceptor substrate positioned to receive said patterned small molecule organic semiconductor layer upon exposing the donor substrate to energy; and an energy source to produce said energy to cause the thermal transfer of a small organic molecule onto the acceptor substrate.

The present invention provides a substrate having thereon a patterned small molecule organic semiconductor layer. FIG. 1 shows a cross sectional view of a substrate 100 with a patterned small molecule organic semiconductor layer 105. The substrate with the patterned small molecule organic semiconductor layer is prepared by exposing a donor substrate which has a small molecule organic semiconductor layer on it to energy produced from an energy source. The exposure causes thermal transfer, such as sublimation and deposition, of a small organic molecule from the small molecule organic semiconductor layer on the donor substrate and the deposition of that small molecule onto an acceptor substrate The donor substrate can be made of an energy absorbing or an energy transparent material, or a combination of absorbing and transparent materials. The donor substrate may also contain areas not directly involved with the thermal transfer process that are neither transparent nor absorptive to energy.

When the donor substrate is made of an energy absorbing material, the small molecule organic semiconductor layer is directly on the donor substrate. In this case the energy is absorbed by the energy absorbing material and heat is produced. It is this heat that causes the thermal transfer of the small organic molecule onto the acceptor substrate.

FIG. 2 shows a cross sectional view of a simple system of the present invention and is illustrative of the method involving an energy absorbing donor substrate. A small molecule organic semiconductor layer 200 has been pre-deposited on an energy absorbing donor substrate 205. The small molecule organic semiconductor layer 200 can also be produced by the at least partial conversion of a precursor of the small organic molecule during the step of exposing the donor substrate to energy. This preferred embodiment of preparing the small molecule organic semiconductor layer from a precursor is discussed in further detail below and can be employed in all embodiments of the current invention. In FIG. 2 energy 215 from energy source 210 is incident on the surface of the energy absorbing donor substrate 205 opposite the small molecule organic semiconductor layer 200. This is a preferred direction from which to direct the energy, however, a person of ordinary skill in the art would be capable of configuring the direction in a variety of ways. Energy 215 is absorbed by the energy absorbing donor substrate 205. Heat from the absorption of energy 215 is rapidly transferred to the small molecule organic semiconductor layer 200 causing the thermal transfer of the small organic molecule from the surface of the donor substrate 205 to the acceptor substrate 100 depositing a patterned small molecule organic semiconductor layer 225 corresponding in area to the heated region of the small molecule organic semiconductor layer 200 on the donor substrate 205. Depending on the relative positioning of the energy 215, donor substrate 205, and the acceptor substrate 100 a wide variety of patterns of the small organic molecule can be formed on the acceptor substrate 100. FIG. 2 shows a single region of deposition indicated by the patterned small molecule organic semiconductor layer 225 which corresponds to the diameter of the energy 215.

When the donor substrate is made of an energy transparent material, an energy absorbing film, such as a thin film, can be interposed between the donor substrate and the small molecule organic semiconductor layer. In this case the energy passes through the energy transparent material of the donor substrate and is absorbed by the energy absorbing film, thus producing heat. It is this heat that causes the thermal transfer of the small organic molecule onto the acceptor substrate. Non-limiting examples of materials for the energy absorbing film include platinum, titanium, chromium, and organics such as KAPTON™.

FIG. 3 shows a cross sectional view of another simple system of the present invention and is illustrative of the method involving an energy transparent donor substrate. A small molecule organic semiconductor layer 200 has been pre-deposited on an energy transparent donor substrate 300 with an energy absorbing film 305 interposed between 200 and 300. Energy 215 from energy source 210 is incident on the surface of the energy transparent donor substrate 300 opposite the small molecule organic semiconductor layer 200. Energy 215 penetrates the energy transparent substrate 300 and is absorbed by the energy absorbing film 305. Heat from the absorption of energy 215 is rapidly transferred to the small molecule organic semiconductor layer 200 causing the thermal transfer of the small organic molecule from the surface of the donor substrate 300 to the acceptor substrate 100 depositing a patterned small molecule organic semiconductor layer 225 corresponding in area to the heated region of the small molecule organic semiconductor layer 200 on the donor substrate 300. Depending on the relative positioning of the energy 215, donor substrate 300, and the acceptor substrate 100 a wide variety of patterns of the small organic molecule can be formed on the acceptor substrate 100. FIG. 3 shows a single region of deposition indicated by the patterned small molecule organic semiconductor layer 225 which corresponds to the diameter of the energy 215.

The donor substrate can be made of any suitable material. Non-limiting examples of materials that are suitable for use as the donor substrate include glass, silicon, polyimide, and polymethyl methacrylate (PMMA).

The acceptor substrate can be made of any suitable material. Non-limiting examples of materials that are suitable for use as the acceptor substrate include glass, silicon, polyimide, and polymethyl methacrylate (PMMA).

The energy absorbing film can be of a thickness of from about 100 to about 20,000 Angstroms. The energy absorbing film can be applied to the donor substrate by any well known process. Non-limiting examples of application methods include sputtering, evaporating, spraying, dipping, spinning, or combinations thereof.

The small molecule organic semiconductor layer can also be applied to the donor substrate by any well known process. Non-limiting examples of application methods include sputtering, evaporating, spraying, dipping, spinning, or combinations thereof.

As mentioned previously, the small molecule organic semiconductor layer on the donor substrate can be a film, such as a thin film, of the small organic molecule itself or it can be formed during the step of exposing the donor substrate to energy from a precursor of the small organic molecule.

In the context of the present invention, the term small organic molecule refers to a non-polymeric organic semiconducting material which is a solid. Examples of such small organic molecules include polycyclic aromatic compounds, such as oligothiophene, perylene, benzo[ghi] perylene, coronene and polyacene.

In the case that the small molecule organic semiconductor layer is formed from a precursor, the chemical structure of the precursor is such that only the small organic molecule becomes transferred by thermal transfer upon application of energy. The remaining chemical constituents of the precursor become volatized and do not deposit on the acceptor substrate.

The small molecule organic semiconductor layer can be made up of the small organic molecule that is to be thermally transferred to the acceptor substrate. The small organic molecule can be a polycyclic aromatic compound. Non-limiting examples of polycyclic aromatic compounds that are useful in the present invention include oligothiophene, perylene, benzo[ghi]perylene, coronene, and polyacene. Preferred polyacenes include those represented by the formula:

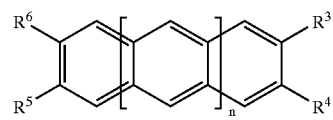

wherein each $R^3$, $R^4$, $R^5$ and $R^6$ is independently selected from the group consisting of: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings; wherein n is at least 1. Pentacene, which is an example of a polyacene, is a preferred, but non-limiting, example of the small organic molecules that can be utilized in this invention.

When the small molecule organic semiconductor layer is produced from a precursor of the small organic molecule, the precursor can be, for example, a precursor to a polycyclic aromatic compound; Diels-Alder adduct of a polycyclic aromatic compound with a dienophile, wherein the polycyclic aromatic compound is selected from: oligothiophene, perylene, benzo[ghi]perylene, coronene and polyacene; and wherein the dienophile is represented by the formula:

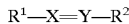

wherein each X and Y can independently be N or $CR^7$; wherein $R^1$—X= can be O, S, SO and $SO_2$; and wherein each $R^1$, $R^2$ and $R^7$ can independently be hydrogen, alkyl of 1–12 carbon atoms, aryl, substituted aryl, aralkyl, alkoxycarbonyl, aryloxycarbonyl, acyl and a group R, wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8CO$— wherein $R^8$ can be hydrogen, alkyl of 1–12 carbon atoms, aryl, substituted aryl, aralkyl and fluoroalkyl;

with the proviso that at least one of X and Y is a hetero atom selected from: N, O and S.

A preferred Diels-Alder adduct of a polycyclic aromatic compound with a dienophile is represented by the formula:

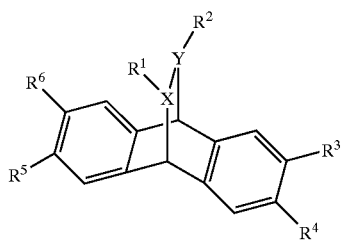

wherein each X and Y is independently selected from: N and $CR^7$;

wherein $R^1$—X= can be O, S, SO and $SO_2$; and wherein each $R^1$, $R^2$ and $R^7$ is independently selected from: hydrogen, alkyl of 1–12 carbon atoms, aryl, substituted aryl, aralkyl, alkoxycarbonyl, aryloxycarbonyl, acyl and a group R, wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8CO$— wherein $R^8$ can be hydrogen, alkyl of 1–12 carbon atoms, aryl, substituted aryl, aralkyl and fluoroalkyl;

with the proviso that at least one of X and Y is a hetero atom selected from: N, O and S The Diels-Alder adduct of a polycyclic aromatic compound with a dienophile can be prepared by a process comprising the step of contacting:

(a) a polycyclic aromatic compound selected from: oligothiophene, perylene, benzo[ghi]perylene, coronene and a compound represented by the formula:

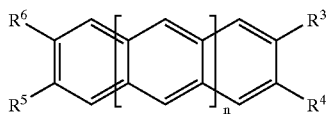

wherein each $R^3$, $R^4$, $R^5$ and $R^6$ is independently selected from: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings, wherein n is at least 1; and (b) dienophile represented by the formula:

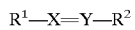

wherein each X and Y is independently selected from: N and $CR^7$; wherein $R^1$—X= can be O, S, SO and $SO_2$; wherein each $R^1$, $R^2$ and $R^7$ is independently selected from: hydrogen, alkyl of 1–12 carbon atoms, aryl, substituted aryl, aralkyl, alkoxycarbonyl, aryloxycarbonyl, acyl and a group R, wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8CO$— wherein $R^8$ can be hydrogen, alkyl of 1–12 carbon atoms, aryl, substituted aryl, aralkyl and fluoroalkyl; with the proviso that at least one of X and Y is a hetero atom selected from: N, O and S;

wherein the contacting is carried out under reaction conditions sufficient to produce the Diels-Alder adduct.

A film, such as a thin film, of a Diels-Alder adduct of a polycyclic aromatic compound with a dienophile can be prepared by a method comprising the steps of:

(a) applying onto a substrate a solution of a Diels-Alder adduct of a polycyclic aromatic compound with a dienophile in a suitable solvent, wherein the polycyclic aromatic compound is selected from: oligothiophene, perylene, benzo[ghi]perylene, coronene and a compound represented by the formula:

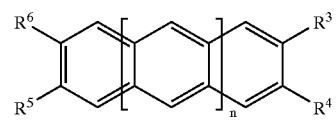

wherein each $R^3$, $R^4$, $R^5$ and $R^6$ is independently selected from: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings, wherein n is at least 1; and wherein the dienophile is represented by the formula:

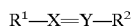

wherein each X and Y is independently selected from: N and $CR^7$; wherein $R^1$—X= can be O, S, SO and $SO_2$; and wherein each $R^1$, $R^2$ and $R^7$ is independently selected from: hydrogen, alkyl of 1–12 carbon atoms, aryl, substituted aryl, aralkyl, alkoxycarbonyl, aryloxycarbonyl, acyl and a group R, wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8CO$— wherein $R^8$ can be hydrogen, alkyl of 1–12 carbon atoms, aryl, substituted aryl, aralkyl and fluoroalkyl; with the proviso that at least one of X and Y is a hetero atom selected from: N, O and S; and (b) evaporating the solvent to produce the film of the Diels-Alder adduct of the polycyclic aromatic compound with the dienophile.

A film, such as a thin film, of a polycyclic aromatic compound can be prepared by a method comprising the steps of:

(a) applying onto a substrate a solution of a Diels-Alder adduct of a polycyclic aromatic compound with a dienophile in a suitable solvent, wherein the polycyclic aromatic compound is selected from: oligothiophene, perylene, benzo[ghi]perylene, coronene and a compound represented by the formula:

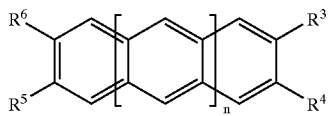

wherein each $R^3$, $R^4$, $R^5$ and $R^6$ is independently selected from: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings, wherein n is at least 1; and wherein the dienophile is represented by the formula:

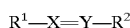

wherein each X and Y is independently selected from: N and $CR^7$; wherein $R^1$—X= can be O, S, SO and $SO_2$; and wherein each $R^1$, $R^2$ and $R^7$ is independently selected from: hydrogen, alkyl of 1–12 carbon atoms, aryl, substituted aryl, aralkyl, alkoxycarbonyl, aryloxycarbonyl, acyl and a group R, wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8CO$— wherein $R^8$ can be hydrogen, alkyl of 1–12 carbon atoms, aryl, substituted aryl, aralkyl and fluoroalkyl; with the proviso that at least one of X and Y is a hetero atom selected from: N, O and S;

(b) evaporating the solvent to produce the film of the Diels-Alder adduct of the polycyclic aromatic compound with the dienophile; and (c) heating the film of the Diels-Alder adduct at a temperature and for a period of time sufficient to convert the Diels-Alder adduct back to the polycyclic aromatic compound.

Other fused aromatic compounds like oligothiophene, perylene (III), benzo[ghi]perylene (IV), coronene (V) and other fused aromatic compounds capable of forming Diels-Alder adducts can also be used to prepare soluble precursors of these sparingly soluble compounds.

III

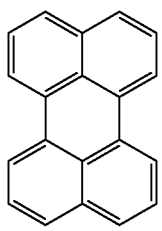

IV

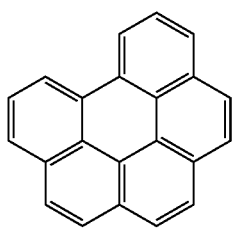

V

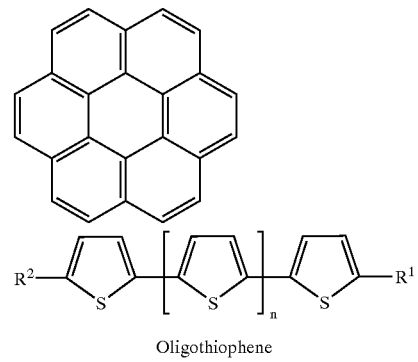

Oligothiophene wherein n is equal or greater than 1, and preferably from 1 to 5; and wherein $R^1$ and $R^2$ are independently selected from the group consisting of hydrogen, alkyl of 1–12 carbon atoms, acyl, alkylphosphonate, hydroxyalkyl, mercaptoalkyl, thiol, carboxylic acid, carboxylic acid ester, trialkoxysilane, amino, alkylamino, dialkylamino and aminoalkane.

A most preferred polycyclic aromatic compound is pentacene. Pentacene, a small molecule organic semiconductor is particularly useful in making organic field effect transistors (FET's), as well as organic light emitting diodes. Such organic semiconductors are particularly attractive as they require relatively low temperature processing, the materials are relatively inexpensive and they can be deposited on flexible substrates. These qualities are all advantageous compared to conventional silicon technology as it is employed today in manufacturing of these devices.

An example of such an adduct wherein the polycyclic aromatic compound is pentacene and the dienophile is a thioxocarboxylate is represented by the formula:

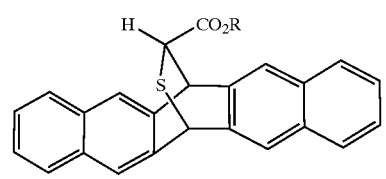

The above Diels-Alder adduct in which the sulfur atom is oxidized to the corresponding sulfoxide is represented by the formula:

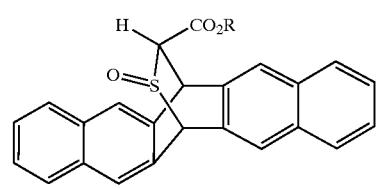

wherein R is selected from: hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein said acyl is represented by the formula: $R^8$ CO— wherein $R^8$ is selected from: hydrogen, alkyl of 1–12 carbon atoms, aryl, substituted aryl, aralkyl and fluoroalkyl;

Another example is the Diels-Alder reaction of thioxomalonate with pentacene to form an adduct with one carbon-sulfur bond as depicted in the following scheme. Diethyl thioxomalonate is prepared in situ from the reaction of diethyl oxomalonate and phosphorous pentasulfide and reacted with pentacene in the presence of a catalyst or by heating in pyridine.

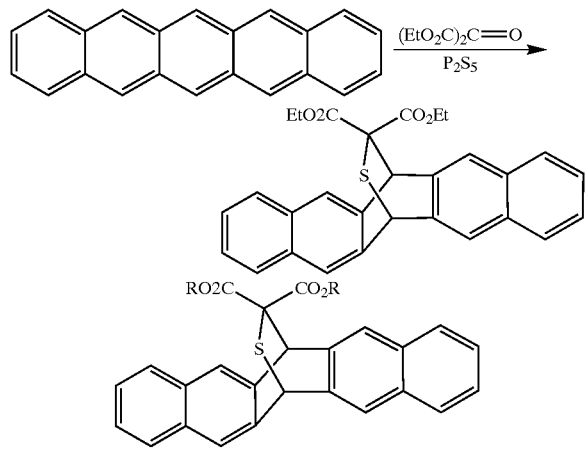

wherein each R is independently selected from: hydrogen, alkyl of 1–12 carbon atoms, alkoxy, acyl, aryl, aralkyl, chloroalkyl, fluoroalkyl and substituted aryl having a substituent selected from: —F, —Cl, —Br, —NO$_2$, —CO$_2$R, —PO$_3$H, —SO$_3$H, trialkylsilyl and acyl; wherein said acyl is represented by the formula: R$^8$CO— wherein R$^8$ is selected from: hydrogen, alkyl of 1–12 carbon atoms, aryl, substituted aryl, aralkyl and fluoroalkyl;

At temperatures higher than 150° C., the thioxomalonate adduct, which is isolated by column chromatography as a white crystalline compound, undergoes a retro Diels-Alder reaction to pentacene. However, if the sulfide is oxidized to corresponding S-oxide, then the adduct can be converted back to pentacene at temperature as low as 150° C.

Both the sulfide and S-oxide adduct are highly soluble in common organic solvents and can be processed from solution to form films on substrates.

Another class of adducts of pentacene is Diels-Alder reaction products of pentacene and dialkyl or diaralkylazodicarboxylates. These compounds are by themselves thermally labile and decompose above 100° C. Therefore, any Diels-Alder reaction of these compounds with pentacene has to be carried out low to moderate temperature.

The Diels-Alder adduct where the dienophile is an azodicarboxylate of the formula RO—CO—N=N—COOR is shown below:

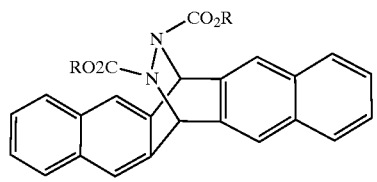

R can be alkyl of 1–12 carbon atoms, aryl, aralkyl, chloroalkyl, fluoroalkyl and substituted aryl having a substituent selected from: —F, —Cl, —Br, —NO$_2$, —CO$_2$R, trialkylsilyl and acyl; wherein the acyl is represented by the formula: R$^8$CO— wherein R$^8$ can be hydrogen, alkyl of 1–12 carbon atoms, aryl, substituted aryl, aralkyl, chloroalkyl and fluoroalkyl.

Preferably, R is benzyl, alkyl of one to five carbon atoms, partially or fully chlorinated alkyl of one to four carbon atoms and partially or fully fluorinated alkyl of one to four carbon atoms.

The above Diels-Alder can be hydrolyzed to form a cyclic diamine compound represented by the formula:

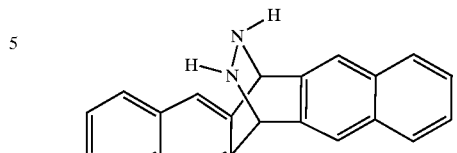

and the diamine can be oxidized to give an azo compound represented by the formula:

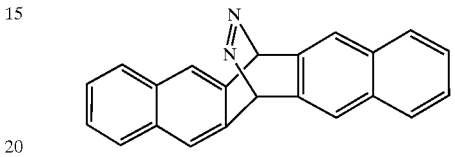

Employing a Lewis acid catalyst, such as, titanium tetrachloride facilitates the Diels Alder reaction so it can be carried out at temperature below −40° C. Alternatively, less active catalysts like silver tetrafluoroborate or methyl rhenium trioxide can be used to run the reaction above room temperature by refluxing the mixture of pentacene, diazodicarboxylate and the catalyst in a low boiling solvent like THF or chloroform.

These diaza adducts of pentacene are stable to high temperatures and as such are not good candidates as pentacene precursors because films of these compounds have to be heated above 280° C. to convert to pentacene. For example, the adduct of diethyl diazodicarboxylate (R=ethyl) has a melting point of 257° C. and is stable up to 300° C. But when the carboxylate groups are hydrolyzed to the corresponding acid, which automatically undergo decarboxylation to form the cyclic diamine, or oxidized form of the latter to diazo derivative, then the adduct becomes highly unstable and can be converted back to pentacene at moderate temperatures (50–100° C.). Thus, an important step in this process is the removal of the carboxylate protecting group at low temperatures so as to be able to isolate the amine or diazo compounds.

The adducts of pentacene with a variety of dialkyl azodicarboxylate were prepared. It was found that bis-trichloroethyl carboxylates (R=CCl$_3$—CH$_2$—) can easily be removed at room temperature in THF by treatment with zinc powder to give the corresponding diamine.

In yet another example of Diels-Alder reaction of pentacene with hetero dienophiles, N-Sulfinyl acetamide (R=CH$_3$CO—) and N-sulfinyl benzyl carbamate (R=C$_6$H$_5$CH$_2$OCO—) were prepared and reacted with pentacene in the presence of methyl rhenium trioxide as Lewis acid catalyst. In both cases, high yields of the adduct were obtained and the compounds found to be highly soluble in many organic solvents.

Films of these compounds were cast from solution and then heated at 120–140° C. to transform the compounds back to pentacene is confirmed by its UV/VIS spectra and thermogravimetric analysis TGA and IR spectrum. Although the onset of the retro Diels-Alder reaction temperature for bulk, as evident from TGA, is about 140° C., films of these compounds can be converted back to pentacene at even lower temperatures of 110–120° C.

In still another example of Diels-Alder reaction of pentacene with hetero dienophiles, a Diels-Alder adduct wherein the dienophile is an N-sulfinyl amide compound is represented by the formula:

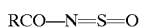

and the adduct is represented by the formula:

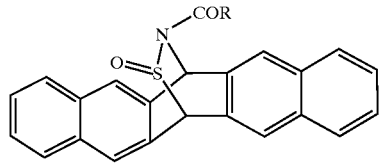

wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —NO$_2$, —CO$_2$R, —PO$_3$H, —SO$_3$H, trialkylsilyl and acyl; wherein the acyl is represented by the formula: R$^8$CO— wherein R$^8$ can be hydrogen, alkyl of 1–12 carbon atoms, aryl, substituted aryl, aralkyl and fluoroalkyl.

The above Diels-Alder adduct can be hydrolyzed to form a compound represented by the formula:

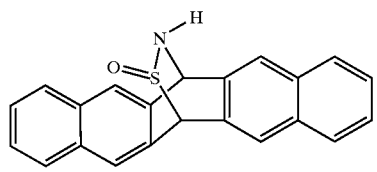

Although only two examples of N-sulfinyl amides are shown here, N-sulfinyl derivatives are equally attractive candidates for the preparation of soluble pentacene adducts.

For example, N-sulfinyl derivative of fluoroalkylamide like trifluoracetamide (R=CF$_3$—CO—) or higher alkyl amides (R=C$_n$H$_{2n+1}$—CO—, where n=1–10) can be used instead of sulfinyl acetamide. N-Sulfinyl derivatives of aromatic amines (R=aryl) where R— is simply a phenyl group or substituted (nitro, keto, halo, alkyl, fluoroalkyl etc) are known to undergo Diels-Alder reactions and can be used to prepare soluble adducts with pentacene.

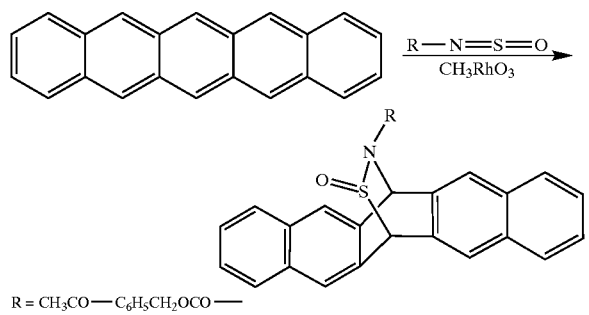

R = CH$_3$CO— C$_6$H$_5$CH$_2$OCO—

In another example of the Diels-Alder reaction of pentacene with a hetero dienophile, a Diels-Alder adduct wherein the dienophile is a nitroso compound is represented by the formula:

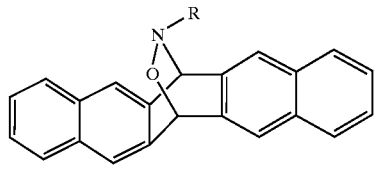

wherein R can be hydrogen, alkyl of 1–12 carbon atoms, alkoxy, acyl, aryl, aralkyl, chloroalkyl, fluoroalkyl, substituted aryl having a substituent selected from: —F, —Cl, —Br, —NO$_2$, —CO$_2$R, —PO$_3$H, —SO$_3$H, trialkylsilyl and acyl; wherein the acyl is represented by the formula: R$^8$CO— wherein R$^8$ can be hydrogen, alkyl of 1–12 carbon atoms, aryl, substituted aryl, aralkyl and fluoroalkyl.

Other acylnitroso compounds of general formula R—CO—N=O are very attractive and judged by its adduct with anthracene derivative can be converted back to pentacene at moderate temperatures. An example would be the reaction of pentacene with N-oxyacetamide (R=CH$_3$—) which can be generated from acetylhydroxamic acid and reacted with pentacene in the presence of methyl rhenium trioxide to give desired adduct as shown bellow.

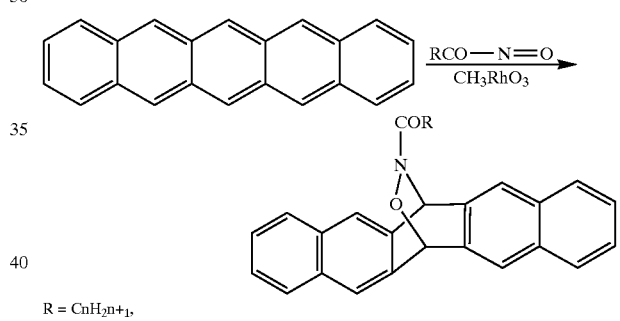

R = C$_n$H$_{2n+1}$,

In the above reaction R— can be chosen from alkyl groups of having one to twelve carbon atoms, halogenated alkyl groups like CF$_3$—(CF$_2$)$_n$— where n is from zero to 10. R could be also an aryl group like phenyl or substituted phenyl with substituents like one or more halogens (Cl, F and Br), nitro group, carboxylic acid or esters, amines or amides, phosphonic acid or ester, trialkyl or trialkoxysilane.

The adducts in which nitrogen is connected to an acyl (RCO) group could further be hydrolyzed to corresponding —NH group by treatment with base as shown in the following reaction.

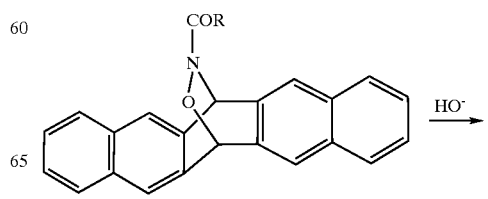

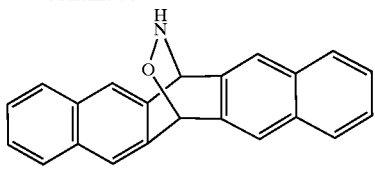

Films of these adducts are prepared from solution by different techniques, e.g., spin-coating, casting, doctor blading, etc. Once films of these adducts on substrates are formed, they can easily be converted back to pentacene by heating the substrate on a hot plate or in an oven at modest temperatures. Any residual compounds other than pentacene formed during retro Diels-Alder reaction can be removed by dipping the substrate solvents like alcohols, ethers, ketones and the like, to get pure pentacene films.

In the examples listed above the diene which was employed in Diels-Alder reactions has been pentacene, but other members of polyacenes like tetracene, hexacene and heptacene (structure I, n=2, 4 and 5 respectively) can also be used to make soluble derivatives with hetero dienophiles.

Although in all the structures depicted so far, the dienophile has attached to the middle ring of pentacene (or polyacene in general) it is possible to have the dienophile react with other ring in polycyclic aromatic compounds like pentacene, as depicted in the following structure with $R^1-X=Y-R^2$ representing hetero dienophiles of this invention:

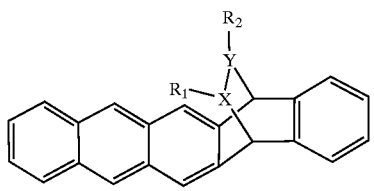

wherein each X and Y is independently selected from: N and $CR^7$;

wherein $R^1-X=$ can be O, S, SO and $SO_2$; and wherein each $R^1$, $R^2$ and $R^7$ is independently selected from: hydrogen, alkyl of 1–12 carbon atoms, aryl, substituted aryl, aralkyl, alkoxycarbonyl, aryloxycarbonyl, acyl and a group R, wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8CO$— wherein $R^8$ can be hydrogen, alkyl of 1–12 carbon atoms, aryl, substituted aryl, aralkyl and fluoroalkyl;

with the proviso that at least one of X and Y is a hetero atom selected from: N, O and S.

In the cases where the small molecule organic semiconductor layer is produced by at least a partial conversion of a precursor of the small organic molecule during the step of exposing the donor substrate to energy the donor substrate has a predeposited thin precursor film thereon. When the donor substrate, and optionally the energy absorbing film, are exposed to the energy, the resultant heat causes the conversion of the precursor to the small molecule organic semiconductor layer and the thermal transfer of the small organic molecule onto the acceptor substrate.

In certain situations, some precursor will sublime and deposit onto the acceptor substrate without conversion to the small organic molecule. In these situations the acceptor substrate can be annealed after the thermal transfer at about the thermal decomposition temperature of the precursor to convert any remaining precursor to the small organic molecule.

It has also been shown that heating the acceptor substrate prior to thermal transfer improves the thermal transfer of the small organic molecule onto the acceptor substrate. Heating is carried out at a temperature in the range from about 25° C. to about 100° C., preferably from about 25° C. to about 75° C., depending on the particular small molecule. This heating can be used alone or in combination with the annealing discussed above.

The energy used to expose the donor substrate can be selected from any sufficient to cause the thermal transfer of the small organic molecule and the conversion of any precursor used. Non-limiting examples of suitable energy from an energy source are infrared, ultraviolet, visible, thermal, electron beam, ion beam, x-ray beam, energy beam, pulsed energy, continuous wave (cw) energy, focused laser, pulsed laser, cw laser, thermal probe, resistive heating, a heated AFM probe, a soldering iron tip, or any combination thereof. A non-limiting example of resistive heating includes resistance losses due to the passage of a local current pulse in contact with the donor substrate. The energy source can produce energy that exposes small portions of the donor substrate at a time to the energy. The energy source can optionally produce energy that floods the donor substrate with energy. A most preferred energy is a focused laser beam.

In the current invention the donor substrate may be moved relative to the energy source and the acceptor substrate. Also, the energy may be moved relative to the donor substrate and the acceptor substrate. Non-limiting examples of this movement include moving the energy source itself and scanning the energy relative to the substrates. Furthermore, the acceptor substrate may be moved relative to the energy source and the donor substrate. All of these movements can be employed singly or in combination. Means for and methods of implementing these movements are well known and one of ordinary skill in the art should be capable of configuring.

FIG. 4 shows a simple system of the present invention having means for moving the acceptor substrate 400 and means for moving the donor substrate 405 relative to each other and the energy 215 from energy source 210. FIG. 4 shows an energy absorbing donor substrate system with an energy absorbing substrate 205 and small molecule organic semiconductor layer 200 for example purposes only, and is not meant to limit the application of the means of movement.

Figure 5:
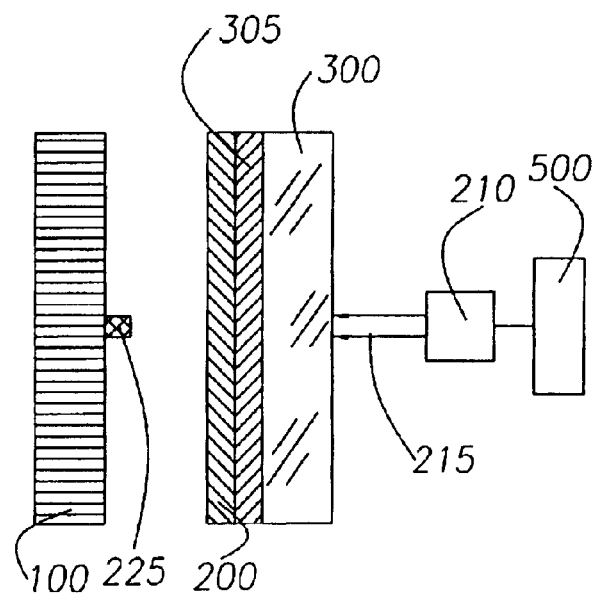
FIG. 5 shows a representative system of this invention with means for moving the energy source relative to the acceptor and donor substrates.

FIG. 5 shows a simple system of the present invention having means for moving the energy source 500 relative to the donor substrate 300 (here, a transparent substrate by example) and acceptor substrate 100. By employing any of the means for movement illustrated in FIGS. 4 and 5, alone or in combination, it is possible to create patterns of the small organic molecule on the surface of the acceptor substrate 100 as indicated by the patterned small molecule organic semiconductor layer 105 in FIG. 1.

Figure 6A:
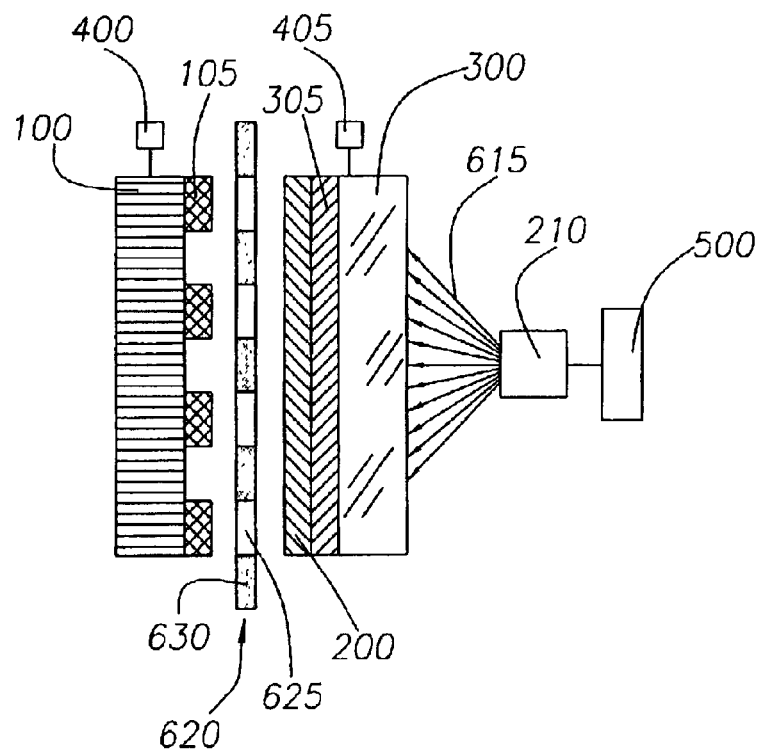
FIG. 6(a) shows an acceptor substrate with means for movement and an energy transparent donor substrate with means for movement, a small molecule organic semiconductor layer, an energy absorbing film, and a source of energy with means for movement wherein the energy flood illuminates the donor substrate. The energy absorbing film absorbs the energy thereby heating the small molecule organic semiconductor layer, thus causing the thermal transfer of the small organic molecule which is patterned onto the acceptor substrate by the insertion of a mask between the donor and acceptor substrates.

An alternative embodiment can further include, possibly eliminating the need to move the substrates and the energy, a mask placed between the donor substrate and the acceptor substrate. FIG. 6a shows a cross sectional view of a simple system of the present invention where a mask 620 with a solid portion 630 and an open portion 625. The open portion 625 corresponds to the desired dimensions of the patterned small molecule organic semiconductor layer 105 to be produced on the acceptor substrate 100. Flood energy 615 is incident on the donor substrate 300 (here, an energy transparent substrate by example). As the generated heat is transferred from the entire illuminated region of energy absorbing film 305, the small molecule organic semiconductor layer 200 sublimes. The solid portion 630 of the mask 625 acts as a physical block to the subliming and depositing small molecule and allows patterning on the acceptor substrate 100 of the patterned small molecule organic semiconductor layer 105.

Figure 6B:
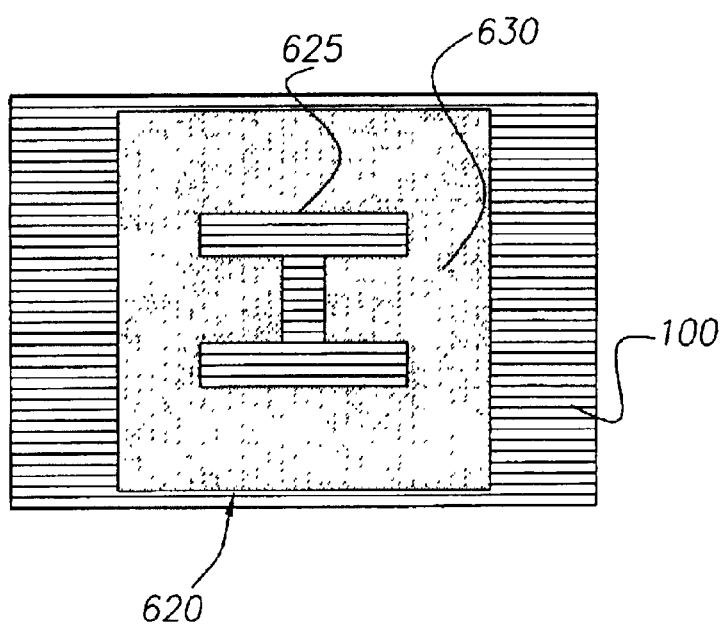
FIG. 6(b) shows a top view of a mask with an "H" pattern opening and an acceptor substrate behind the mask.

FIG. 6b shows a top view of a mask 620 with solid portion 630 and open portion 625. Here, the open portion 625 is dimensioned as an "H" pattern, however, any desired pattern dimensions can be utilized. The acceptor substrate 100 is visible below the mask.

In another embodiment the donor substrate is a disk mounted on a rotatable axis. The donor substrate can be rotated around the axis and the energy incident at a point on the donor substrate. As the donor substrate rotates, the energy causes the heating, and thus the thermal transfer, of a new portion of the small molecule organic semiconductor layer. By displacing the axis relative to the energy and/or by moving the energy relative to the disk, the entire portion of the small molecule organic semiconductor layer can be utilized. The acceptor substrate may also be moved.

FIG. 7 shows a cross sectional view of an example of the disk mounted on a rotatable axis embodiment. Here, an energy transparent substrate 300 with an energy absorbing film 305 is used by example. The energy transparent substrate 300 is in the form of a rotatable disk 700 attached at an axis 710 to a means to rotate the disk 705. Energy 215 from energy source 210 is incident on the disk such to cause the heating of the small molecule organic semiconductor layer 200 pre-deposited thereon and the thermal transfer of the small organic molecule onto the acceptor substrate 100. FIG. 7 shows a patterned small molecule organic semiconductor layer 225 corresponding to the width of the energy 215. By rotating the disk 700 a different region of the small molecule organic semiconductor layer 200 would be affected by the energy 215 and thus sublimed and deposited on the acceptor substrate 100. Means for displacing the disk axis 715 can be utilized to move the disk 700 in relation to the energy 215 and acceptor substrate 100, for example to bring energy 215 incident upon a different radius of disk 700 and thus utilize the full area of the small molecule organic semiconductor 200. Alternately or in combination with 715, means for moving the energy 500 can be utilized. Means for moving the acceptor substrate 400 can also be utilized singly or in combination with the movement of the other components.

The method and system of the present invention can be practiced in a vacuum or under regular atmospheric conditions. Under regular atmospheric conditions the donor substrate and acceptor substrate can be in contact or separated slightly, typically by less than 1 cm. It has also been unexpectedly found that the thermal transfer is improved when the small molecule organic semiconductor layer on the donor substrate and the acceptor substrate are in intimate contact. Intimate contact refers to having a contact area which is substantially free of atmospheric gases. In certain situations it is necessary to apply pressure to achieve this intimate contact. Non-limiting examples of methods of applying pressure include a planar pressure device, an illuminated doctor blade, and a waveguide tip.

The system, method, and product of the present invention achieve thermal transfer of small molecule organic semiconductor or semiconducting film from one surface to a second surface. This type of transfer makes it possible, for example, to 'print' channels onto field effect transistor structures or to deposit regions of small molecule organic semiconducting films for organic light emitting diodes.

To achieve these examples of the present invention, components to an electronic structure can be added to the substrate. FIG. 8 shows an acceptor substrate 100 having thereon a component to an electronic structure 800 with a patterned small molecule organic semiconductor layer 225. In a preferred embodiment, the component to an electronic structure can comprise source, drain, and gate elements of a field effect transistor. In this preferred embodiment, the patterned small molecule organic semiconductor layer forms a channel of the field effect transistor. FIG. 9 shows one simple example of a field effect transistor on an acceptor substrate 100 with gate 905, gate oxide 910, drain 915, and source 920 elements. The patterned small molecule organic semiconductor layer 105 forms the channel of the field effect transistor. In another preferred embodiment, the patterned small molecule organic semiconductor layer forms an active layer of an organic light emitting diode. In another preferred embodiment, the components to an electronic structure are components of a photodiode.

Figure 10:
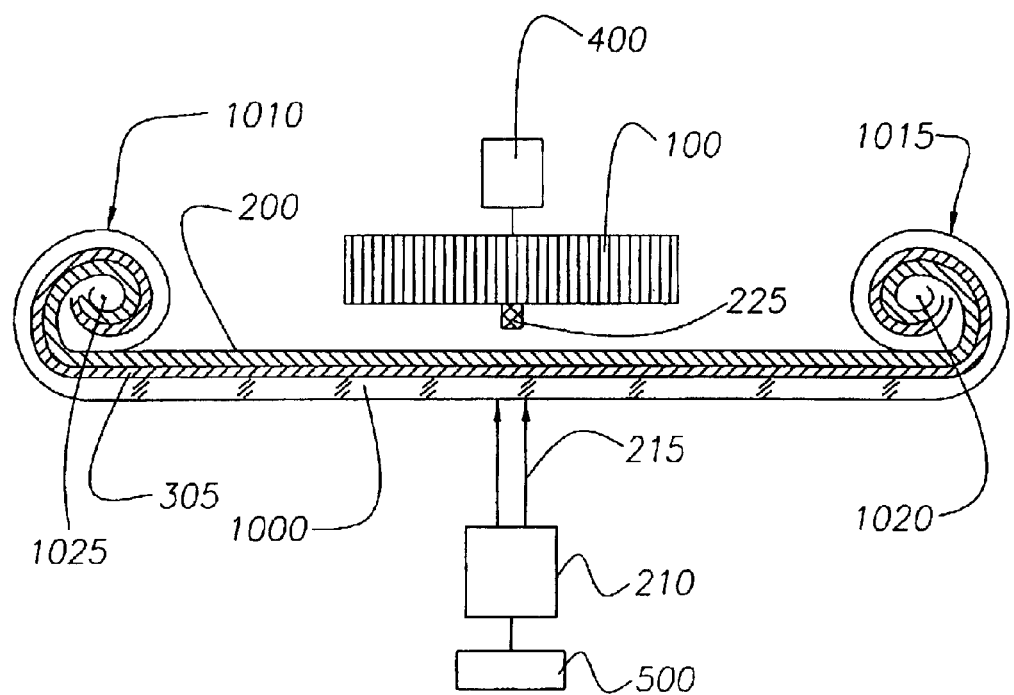
FIG. 10 shows a reel-to-reel apparatus where the donor substrate is a ribbon that is wound from one reel to the other while energy causes the thermal transfer of small molecule from the donor substrate to the acceptor substrate.

In yet another embodiment, the donor substrate is a ribbon. The ribbon can be rigid or flexible depending on the application. When the donor substrate is a ribbon, it is possible for the ribbon to be part of a reel-to-reel apparatus. FIG. 10 shows a ribbon 1000 (here for example purposes only made of a flexible, energy transparent material) with an energy absorbing film 305 and small molecule organic semiconductor layer 200 deposited along the entire length of the ribbon 1000. A preferred reel-to-reel apparatus has a reel 1010 around which is wound the ribbon and another reel 1015 onto which the ribbon is wound as the ribbon passes through an area where it is exposed to the energy 215 from energy source 210 and the small molecule organic semiconductor layer 200 sublimes and is deposited onto the acceptor substrate 100. As the ribbon 1000 is wound around spindle 1020 of reel 1015 by a means configurable by one of ordinary skill in the art, a patterned small molecule organic semiconductor layer 225 (here, for example purposes, dimensioned corresponding to the radius of the incident energy 215). As with other embodiments of the invention, it is possible to have means for moving the energy 500 and means for moving the acceptor substrate 200. One result of this relative movement is the production any number of different patterns of the small organic molecule on the acceptor substrate.

In still yet another embodiment, the donor substrate is in the shape of a hollow cylindrical roller having an inner and an outer surface. The outer surface is where the small molecule organic semiconductor layer resides. As is possible in all embodiments of the invention, when the hollow cylindrical roller is made of an energy transparent material, there can be an energy absorbing film between the outer surface of the hollow cylindrical roller and the small molecule organic semiconductor layer. The basic structure of the novel apparatus consists of a hollow cylinder or drum free to rotate by computer control, with the cylinder preferably made from a material that transmits light in the visible, for example glass or plastic. In one embodiment, the outer periphery of the cylinder has a thin coating of an optically absorbing material with the small molecule organic semiconductor layer disposed thereon. Again, the small organic molecule may be pentacene or one of its precursors but again not limited to that particular small molecule organic semiconductor.

The energy source can be at a point within the hollow cylindrical roller. The energy source within the hollow cylindrical roller can be one or more laser diodes. Typically, the point is along the axis of the hollow cylindrical roller such that the energy from the energy source is directed at the inner surface of the hollow cylindrical roller in the direction of the acceptor substrate. Alternatively, the energy source can be along a line, preferably parallel to the axis of the cylinder. This line can be close to the periphery of the cylinder. A means for moving the axis of the cylinder from the true axis of the cylinder can also be employed to bring the energy source to different positions relative to the periphery of the cylinder. It is possible for this energy source to be moveable from one point to another within the hollow cylindrical roller, usually, but not restricted to, along the axis. The energy source can be computer controlled with respect to its on-off modes of operation and location. Typically the on-off modes of operation are controlled with respect to time and the relative position of the hollow cylindrical roller and the energy source. An example of the placement of the energy source is a single laser diode that can be moved along the mounting axis and the roller moved stepwise after the laser has traversed the entire length of the roller axis with the laser pulsed at designated positions to bring about thermal transfer.

The roller can be rolled in relation to the acceptor substrate. A non-limiting example of a suitable acceptor substrate is a flat sheet, preferably a plastic sheet placed on a hard, non-compliant surface wherein the hollow cylindrical roller is made to roll over the plastic sheet and the energy causes the thermal transfer of the small organic molecule from the outside of the hollow cylindrical roller to the acceptor substrate. As mentioned above, the thermal transfer is improved when the small molecule organic semiconductor layer and the acceptor substrate are in intimate contact. Often this intimate contact is achieved through the application of pressure so that the small molecule organic semiconductor layer and the acceptor substrate have a contact area which is substantially free of atmospheric gases. A thermal transfer of the organic material is made from the cylinder (donor) onto the acceptor substrate as has been previously shown in a simpler embodiment by experimentation.

The energy absorbing film and the small molecule organic semiconductor layer can be applied to the hollow cylindrical roller by any well known method. Examples of these methods include sputtering, evaporating, spraying, dipping, spinning, and combinations thereof.

Figures 11A, 11B:
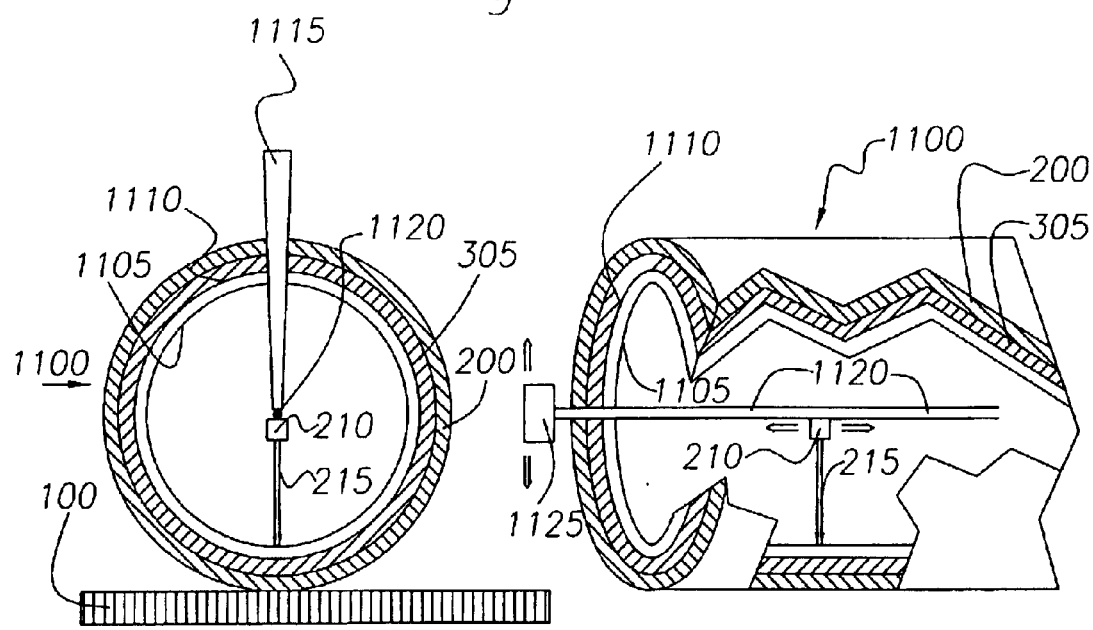
FIG. 11(a) shows a side view of a hollow cylindrical roller where the energy source is at a point along the axis. The hollow cylindrical roller is here constructed of an energy transparent material and has thereon a small molecule organic semiconductor layer with an energy absorbing film therebetween. The energy from the energy source is incident on the inner surface of the hollow cylindrical roller in the direction of the acceptor substrate and causes the thermal transfer of small molecule from the hollow cylindrical roller to the acceptor substrate. This figure illustrates the optional means for exerting pressure on the hollow cylindrical roller to place it in intimate contact with the acceptor substrate.
FIG. 11(b) shows a cross sectional view of a hollow cylindrical roller where the energy source is at a point along the axis with the ability to move along the axis and to have the axis moved relative to the hollow cylindrical roller.

FIG. 11a shows a cross sectional view of an example of the hollow cylindrical roller embodiment. Here, hollow cylindrical roller 1100 has an outer material that is energy transparent with an inner surface 1105 and an outer surface 1110. An energy absorbing film 305 has been disposed on the outer surface 1110 and a small molecule organic semiconductor layer 200 has been disposed thereon. Energy 215 from energy source 210 situated at a point 1120 within the hollow cylindrical roller is incident on the inner surface 1105 in the direction of the acceptor substrate 100 which is to receive the thermal transfer of the small organic molecule. FIG. 11a further shows the optional means for applying pressure 1115. FIG. 11b shows a cut away view of a hollow cylindrical roller 1100 with the energy source 210 positioned at a point along the axis 1120 of the hollow cylindrical roller. Means for displacing 1125 the axis from true center is shown and the energy source 210 is movable along the axis 1120. Energy 215 is incident on the inner surface 1105 of the hollow cylindrical roller. It is possible for the hollow cylindrical roller to be made of an energy absorbing material (not shown) and to have the small molecule organic semiconductor layer directly thereon.

In another embodiment, the energy source is disposed at a point within a hollow cylindrical roller having an inner and an outer surface. Here, the donor substrate is a first rigid or flexible material sheet having the small molecule organic semiconductor layer thereon. The acceptor substrate is a second rigid or flexible material sheet. The material sheets are passed simultaneously between the hollow cylindrical rollers and a second roller which are in contact with one another along their longitudinal axes such to permit the thermal transfer of the small organic molecule from the first material sheet to the second material sheet.

One or both of the two rollers may be slightly compliant, thereby allowing more than just line contact along the axis of the roller. This allows thermal transfer of material over small linear distances in a direction that is perpendicular to the axis of the roller also controlled in part by the shape of the energy. The apparatus can be made to allow for a constant feed-through of both materials to provide large scale production.

It is possible that the first material sheet and the small molecule organic semiconductor layer have an energy absorbing film interposed between them. Often when the first material sheet is an energy transparent material, this energy absorbing film is necessary to absorb the energy. The material sheets can be made of any suitable material. In a preferred embodiment the material sheets are made of a flexible plastic. Non-limiting examples of flexible plastic include MYLAR™ and KAPTON™.

It is also possible, however, for the first material sheet to be an energy absorbing material.

The energy source within the hollow cylindrical roller can be one or more laser diodes. Typically, the energy source is along the axis of the hollow cylindrical roller such that the energy from the energy source is directed at the inner surface of the hollow cylindrical roller in the direction of the acceptor substrate. It is possible for this energy source to be moveable from one point to another within the hollow cylindrical roller, usually, but not restricted to, along the axis. The energy source can be computer controlled with respect to its on-off modes of operation. Typically this the on-off modes of operation are controlled with respect to time and the relative position of the hollow cylindrical roller.

As mentioned above, the thermal transfer is improved when the small molecule organic semiconductor layer and the acceptor substrate are in intimate contact. Often this intimate contact is achieved through the application of pressure so that the small molecule organic semiconductor layer and the acceptor substrate have a contact area which is substantially free of atmospheric gases. For example, the two rollers can be brought into intimate contact at a predetermined compression set by adjustable springs on at least one of the rollers or by any other means capable of producing such intimate contact.

Figure 12:
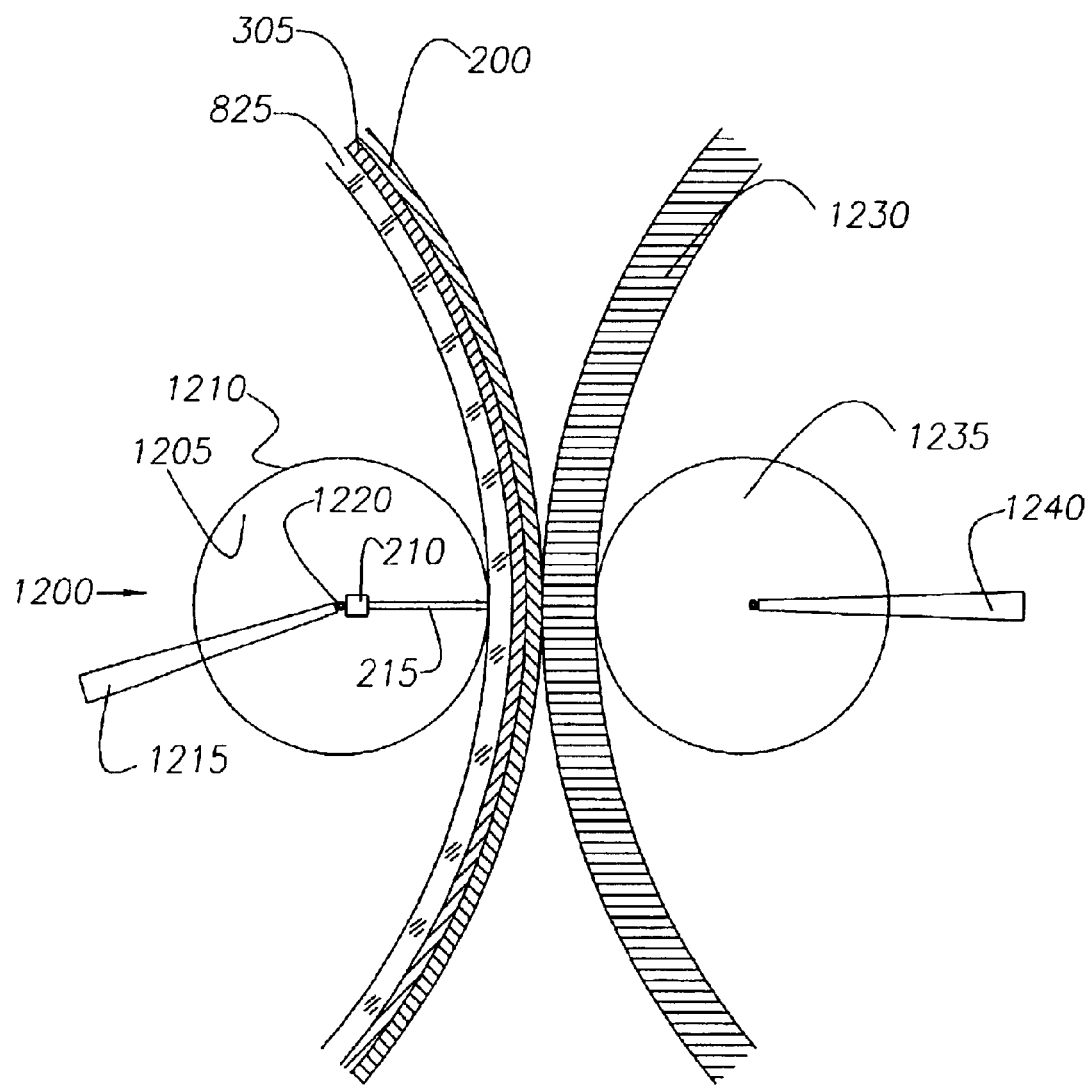
FIG. 12 shows an energy transparent donor substrate with an energy absorbing film and a small molecule organic semiconductor layer passing in intimate contact with an acceptor substrate between a hollow cylindrical roller with an energy source at a point within and a second roller. Each roller depicted has optional means for exerting pressure.

FIG. 12 shows a cross sectional view of an example of the foregoing embodiment. A first material sheet 825 (here made of a energy transparent material) with an energy absorbing film 305 and a small molecule organic semiconductor layer 200 and a second material sheet 1230 are simultaneously passed between a hollow cylindrical roller 1200 and a second roller 1235. Energy 215 from energy source 210 along the axis 1220 of the hollow cylindrical roller 1200 is incident on the inner surface 1205 of the hollow cylindrical roller 1200. The energy passes through the hollow cylindrical roller and the energy transparent first material sheet 825 thus being absorbed by the energy absorbing film 305 causing heat to be transferred to the small molecule organic semiconductor layer 200. This heat causes the thermal transfer of small molecule to the second material sheet 1230. FIG. 12 shows optional means 1215 and 1240 for applying pressure.

To those skilled in the art, it is clear that many possible variations of these configurations are possible.

In addition to being directed to the method for preparing the substrate having the patterned small molecule organic semiconductor layer thereon, this invention is directed to a substrate with a patterned small molecule organic semiconductor layer comprising a small organic molecule thermally transferred by exposing a donor substrate having thereon a small organic molecule organic semiconductor layer to energy.

The invention is still further directed to a system for producing a substrate having thereon the patterned small molecule organic semiconductor layer. Features of the production of a substrate having thereon the patterned small molecule organic semiconductor have been discussed in detail in relation to the method herein above. The system includes a donor substrate with a small molecule organic semiconductor layer thereon; an acceptor substrate positioned to receive the patterned small molecule organic semiconductor layer upon exposing the donor substrate to energy; and an energy source to produce the energy to cause the thermal transfer of a small organic molecule onto the acceptor substrate.

The features of the following embodiments of the system, and other embodiments of the system have been described in detail in relation to the method herein above.

The system of the present invention can also include an energy absorbing film interposed between the donor substrate and the small molecule organic semiconductor layer to absorb the energy and cause thermal transfer of the small organic molecule.

As discussed above in relation to the method the small molecule organic semiconductor layer can be produced by an at least partial conversion of a precursor of the small organic molecule during the exposing of the donor substrate.

The system can have a heating source to anneal the acceptor substrate after the thermal transfer of the patterned small molecule organic semiconductor layer on the acceptor substrate. The annealing can be performed at about the thermal decomposition temperature of the precursor to convert any remaining precursor to small molecule.

The system can have means for relatively moving the donor substrate, acceptor substrate, energy source, or a combination thereof.

The system can have a mask, wherein the mask is interposed between the donor substrate and the acceptor substrate.

The system can have a donor substrate that is a rigid or flexible ribbon. The ribbon can be part of a reel to reel apparatus.

The system can have a donor substrate that is a disk mounted on a rotatable axis.

The system can include components of an electronic structure as described in detail relative to the method of the invention.

The system can have a donor substrate that is in the shape of a hollow cylindrical roller having an inner and an outer surface, wherein the outer surface has thereon a small molecule organic semiconductor layer.

The system can have an energy source that is disposed at a point within a hollow cylindrical roller having an inner and an outer surface; wherein the donor substrate is an optically transparent first rigid or flexible material sheet having an energy absorbing film interposed between the donor substrate and a small molecule semiconductor layer. An acceptor substrate is a second rigid or flexible material sheet. The first and second material sheets are passed simultaneously between the hollow cylindrical roller and a second roller. The rollers can be in contact with one another along their longitudinal axes to permit the thermal transfer of the small organic molecule from the first material sheet to the second material sheet.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. A method of preparing a substrate having thereon a patterned small molecule organic semiconductor layer, said method comprising:

exposing a donor substrate having thereon a small molecule organic semiconductor layer to energy produced from an energy source to cause the thermal transfer of a small organic molecule onto an acceptor substrate to produce a substrate having thereon said patterned small molecule organic semiconductor; wherein said small molecule organic semiconductor layer is produced by at least a partial conversion of a precursor of said small organic molecule during the step of exposing said donor substrate.

2. The method of claim 1, wherein said donor substrate and said small molecule organic semiconductor layer have an energy absorbing film interposed therebetween.

3. The method of claim 1, wherein said donor substrate is an energy absorbing material or an energy transparent material.

4. The method of claim 1, wherein said patterned small molecule organic semiconductor layer comprises a polycyclic aromatic compound, said polycyclic aromatic compound represented generally by the formula:

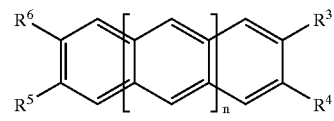

wherein each $R^3$, $R^4$, $R^5$ and $R^6$ is independently selected from the group consisting of: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings; and wherein n is at least 1.

5. The method of claim 4, wherein said polycyclic aromatic compound is pentacene.

6. The method of claim 1, wherein said precursor is a precursor to a polycyclic aromatic compound;

wherein said precursor to a polycyclic aromatic compound is a Diels-Alder adduct of a polycyclic aromatic compound with a dienophile, wherein said polycyclic aromatic compound is selected from the group consisting of: oligothiophene, perylene, benzo[ghi]perylene, coronene and polyacene; and wherein said dienophile is represented by the formula:

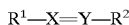

wherein each X and Y is independently selected from the group consisting of: N and CR$^7$;

wherein R$^1$—X= is selected from the group consisting of: O, S, SO and SO$_2$; and wherein each R$^1$, R$^2$ and R$^7$ is independently selected from the group consisting of: hydrogen, alkyl of 1–12 carbon atoms, aryl, substituted aryl, aralkyl, alkoxycarbonyl, aryloxycarbonyl, acyl and a group R, wherein R is selected from the group consisting of: hydrogen, alkyl of 1–12 carbon atoms, alkoxy, acyl, aryl, aralkyl, chloroalkyl, fluoroalkyl and substituted aryl having a substituent selected from the group consisting of: —F, —Cl, —Br, —NO$_2$, —CO$_2$R, —PO$_3$H, —SO$_3$H, trialkylsilyl and acyl; wherein said acyl is represented by the formula: R$^8$CO— wherein R$^8$ is selected from the group consisting of: hydrogen, alkyl of 1–12 carbon atoms, aryl, substituted aryl, aralkyl and fluoroalkyl;

with the proviso that at least one of X and Y is a hetero atom selected from the group consisting of: N, O and S.

7. The method of claim 1, wherein said energy is selected from the group consisting of: infrared, ultraviolet, visible, thermal, electron beam, ion beam, energy beam, pulsed energy, continuous wave (cw) energy, focused laser, pulsed laser, cw laser, thermal probe, resistive heating, a heated AFM probe, a soldering iron tip, and combinations thereof.

8. The method of claim 1, wherein said acceptor substrate is heated.

9. The method of claim 8, wherein said heating is carried out in a manner selected from the group consisting of:
(a) prior to said thermal transfer of said patterned small molecule organic semiconductor layer, wherein said heating is carried out at a temperature in the range from about 25° C. to about 100° C., depending on the particular said small organic molecule;
(b) after said deposition of said patterned small molecule organic layer on said acceptor substrate, wherein said heating is at about the thermal decomposition temperature of said precursor to convert any remaining precursor to said small organic molecule.
(c) any combination of (a)–(b) above.

10. The method of claim 1, further comprising a step selected from the group consisting of:
(a) moving said donor substrate relative to said energy source and said acceptor substrate;
(b) moving said energy relative to said donor substrate and said acceptor substrate; p1 (c) moving said acceptor substrate relative to said energy source and said donor substrate; and
(d) any combination of (a)–(d) above.

11. The method of claim 1, further comprising:
inserting a mask between said donor substrate and said acceptor substrate.

12. The method of claim 1, wherein said donor substrate is a disk mounted on a rotatable axis.

13. The method of claim 1, wherein said energy is a focused laser.

14. The method of claim 13, wherein said patterned small molecule organic semiconductor layer is a channel of a field effect transistor.

15. The method of claim 13, wherein said small molecule organic semiconductor layer forms an active layer of an organic light emitting diode.

16. The method of claim 1, wherein said donor substrate is a rigid or flexible ribbon.

17. The method of claim 16, wherein said ribbon is part of a reel to reel apparatus.

18. The method of claim 1, wherein said donor substrate is in the shape of a hollow cylindrical roller having an inner and an outer surface, said outer surface having thereon said small molecule organic semiconductor layer.

19. The method of claim 18, wherein said energy source is at a point within said hollow cylindrical roller.

20. The method of claim 19, wherein said point within said hollow cylindrical roller is along the axis of said hollow cylindrical roller such that said energy from said energy source is directed at said inner surface of said hollow cylindrical roller in the direction of said acceptor substrate.

21. The method of claim 19, wherein said energy source is computer controlled with respect to on-off modes of operation.

22. The method of claim 1, wherein said energy source is disposed at a point within a hollow cylindrical roller having an inner and an outer surface;
wherein said donor substrate is a first rigid or flexible material sheet having said small molecule organic semiconductor layer thereon;
wherein said acceptor substrate is a second rigid or flexible material sheet,
wherein said first and said second material sheets are passed simultaneously between said hollow cylindrical roller and a second roller, said rollers being in contact with one another along their longitudinal axes to permit said sublimation and said deposition of said small organic molecule from said first material sheet to said second material sheet.

23. A method of preparing a substrate having thereon a patterned small molecule organic semiconductor layer, said method comprising:
exposing a donor substrate having thereon a small molecule organic semiconductor layer to energy produced from an energy source to cause the thermal transfer of a small organic molecule onto an acceptor substrate to produce a substrate having thereon said patterned small molecule organic semiconductor layer;
wherein said patterned small molecule organic semiconductor layer comprises a polycyclic aromatic compound, said polycyclic aromatic compound represented generally by the formula:

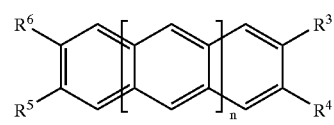

wherein each R$^3$, R$^4$, R$^5$ and R$^6$ is independently selected from the group consisting of: hydrogen, alkyl of 1–12 carbon atoms, aryl, substituted aryl, a group wherein R$^3$ and R$^4$ together form one or more fused benzo rings and a group wherein R$^5$ and R$^6$ together form one or more fused benzo rings; and
wherein n is at least 1.

24. The method of claim 23, wherein said polycyclic aromatic compound is pentacene.

25. The method of claim 23, wherein said energy is selected from the group consisting of: infrared, ultraviolet, visible, thermal, electron beam, ion beam, energy beam, pulsed energy, continuous wave (cw) energy, focused laser, pulsed laser, cw laser, thermal probe, resistive heating, a heated AFM probe, a soldering iron tip, and combinations thereof.

26. The method of claim 23, wherein said acceptor substrate is heated.

27. The method of claim 26, wherein said heating is carried out in a manner selected from the group consisting of:
   (a) prior to said thermal transfer of said patterned small molecule organic semiconductor layer, wherein said heating is carried out at a temperature in the range from about 25° C. to about 100° C., depending on the particular said small organic molecule;
   (b) after said deposition of said patterned small molecule organic layer on said acceptor substrate, wherein said heating is at about the thermal decomposition temperature of said precursor to convert any remaining precursor to said small organic molecule.
   (c) any combination of (a)–(b) above.

28. The method of claim 23, further comprising a step selected from the group consisting of:
   (a) moving said donor substrate relative to said energy source and said acceptor substrate;
   (b) moving said energy relative to said donor substrate and said acceptor substrate;
   (c) moving said acceptor substrate relative to said energy source and said donor substrate; and
   (d) any combination of (a)–(d) above.

29. The method of claim 23, further comprising:
   inserting a mask between said donor substrate and said acceptor substrate.

30. The method of claim 23, wherein said donor substrate is a disk mounted on a rotatable axis.

31. A method of preparing a substrate having thereon a patterned small molecule organic semiconductor layer, said method comprising:
   exposing a donor substrate having thereon a small molecule organic semiconductor layer to energy produced from an energy source to cause the thermal transfer of a small organic molecule onto an acceptor substrate to produce a substrate having thereon said pattered small molecule organic semiconductor layer;
   wherein said acceptor substrate is heated.

32. The method of claim 31, wherein said heating is carried out in a manner selected from the group consisting of:
   (a) prior to said thermal transfer of said patterned small molecule organic semiconductor layer, wherein said heating is carried out at a temperature in the range from about 25° C. to about 100° C., depending on the particular said small organic molecule;
   (b) after said deposition of said patterned small molecule organic layer on said acceptor substrate, wherein said heating is at about the thermal decomposition temperature of said precursor to convert any remaining precursor to said small organic molecule.
   (c) any combination of (a)–(b) above.

33. The method of claim 31, further comprising a step selected from the group consisting of:
   (a) moving said donor substrate relative to said energy source and said acceptor substrate;
   (b) moving said energy relative to said donor substrate and said acceptor substrate;
   (c) moving said acceptor substrate relative to said energy source and said donor substrate; and
   (d) any combination of (a)–(d) above.

34. The method of claim 31, further comprising: inserting a mask between said donor substrate and said acceptor substrate.

35. The method of claim 31, wherein said donor substrate is a disk mounted on a rotatable axis.

36. A method of preparing a substrate having thereon a patterned small molecule organic semiconductor layer, said method comprising:
   exposing a donor substrate having thereon a small molecule organic semiconductor layer to energy produced from an energy source to cause the thermal transfer of a small organic molecule onto an acceptor substrate to produce a substrate having thereon said patterned small molecule organic semiconductor layer;
   wherein said donor substrate is a disk mounted on a rotatable axis.

37. The method of claim 36, wherein said donor substrate and said small molecule organic semiconductor layer have an energy absorbing film interposed therebetween.

38. The method of claim 36, wherein said donor substrate is an energy absorbing material or an energy transparent material.

39. The method of claim 36, wherein said patterned small molecule organic semiconductor layer comprises a polycyclic aromatic compound, said polycyclic aromatic compound represented generally by the formula:

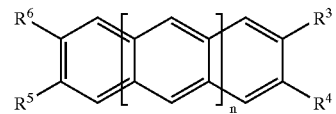

wherein each $R^3$, $R^4$, $R^5$ and $R^6$ is independently selected from the group consisting of: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings; and
wherein n is at least 1.

40. The method of claim 39, wherein said polycyclic aromatic compound is pentacene.

41. The method of claim 36, wherein said small molecule organic semiconductor layer is produced by at least a partial conversion of a precursor of said small organic molecule during the step of exposing said donor substrate.

42. The method of claim 41, wherein said precursor is a precursor to a polycyclic aromatic compound; wherein said precursor to a polycyclic aromatic compound is a Diels-Alder adduct of a polycyclic aromatic compound with a dienophile, wherein said polycyclic aromatic compound is selected from the group consisting of: oligothiophene, perylene, benzo perylene, coronene and polyacene; and wherein said dienophile is represented by the formula:

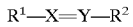

wherein each X and Y is independently selected from the group consisting of: N and $CR^7$;
wherein $R^1$—X= is selected from the group consisting of: O, S, SO and $SO_2$; and
wherein each $R^1$, $R^2$ and $R^7$ is independently selected from the group consisting of: hydrogen, alkyl of 1–12 carbon atoms, aryl, substituted aryl, aralkyl, alkoxycarbonyl, aryloxycarbonyl, acyl and a group R, wherein R is selected from the group consisting of: hydrogen, alkyl of 1–12 carbon atoms, alkoxy, acyl, aryl, aralkyl, chloroalkyl, fluoroalkyl and substituted aryl having a substituent selected from the group consisting of: —F, —Cl, —Br, —$NO_2$, —$CO_2R$, —$PO_3H$, —$SO_3H$, trialkylsilyl and acyl; wherein said acyl is represented by the formula: $R^8CO$— wherein $R^8$ is selected from the group consisting of: hydrogen, alkyl of 1–12 carbon atoms, aryl, substituted aryl, aralkyl and fluoroalkyl;

with the proviso that at least one of X and Y is a hetero atom selected from the group consisting of: N, O and S.

43. The method of claim 36, wherein said energy is selected from the group consisting of: infrared, ultraviolet, visible, thermal, electron beam, ion beam, energy beam, pulsed energy, continuous wave (cw) energy, focused laser, pulsed laser, cw laser, thermal probe, resistive heating, a heated AFM probe, a soldering iron tip, and combinations thereof.

* * * * *